United States Patent [19]
Okudaira et al.

[11] Patent Number: 4,985,114
[45] Date of Patent: Jan. 15, 1991

[54] DRY ETCHING BY ALTERNATELY ETCHING AND DEPOSITING

[75] Inventors: Sadayuki Okudaira, Ome; Hiroshi Kawakami, Hachioji; Tokuo Kure, Tokyo; Kazunori Tsujimoto, Higashiyamato; Shinichi Tachi, Sayama, all of Japan

[73] Assignee: Hitachi, Ltd., Tokyo, Japan

[21] Appl. No.: 418,223

[22] Filed: Oct. 6, 1989

[30] Foreign Application Priority Data

Oct. 14, 1988 [JP] Japan .................................. 63-256953

[51] Int. Cl.$^5$ .................. H01L 21/306; H01L 21/321; H01L 21/311
[52] U.S. Cl. ..................................... 156/643; 156/653; 156/662; 156/661.1; 437/228; 204/192.3; 204/192.32
[58] Field of Search ..................... 156/643, 661.1, 653, 156/662; 204/192.3, 192.32; 437/228

[56] References Cited

U.S. PATENT DOCUMENTS

| | | | |
|---|---|---|---|
| 4,363,868 | 12/1982 | Tasaka et al. | 437/228 |
| 4,529,475 | 7/1985 | Okano et al. | 156/662 |
| 4,579,623 | 4/1986 | Suzuki et al. | 156/643 |
| 4,599,135 | 7/1986 | Tsunekawa et al. | 156/643 |
| 4,705,595 | 11/1987 | Okudaira et al. | 156/643 |
| 4,732,761 | 3/1988 | Machida | 437/228 |
| 4,795,529 | 1/1989 | Kawasaki et al. | 156/662 |

FOREIGN PATENT DOCUMENTS 0204538 12/1986 European Pat. Off. .
3604342 8/1986 Fed. Rep. of Germany .

OTHER PUBLICATIONS

Tsujimoto et al., "A New Side Wall Protection Technique in Microwave Plasma Etching Using a Chopping Method", Extended Abstracts of the 18th Int. Conference on Solid State Devices and Materials, Tokyo, Japan, Aug., 1986, pp. 229-232.

Primary Examiner—David L. Lacey
Assistant Examiner—Todd J. Burns
Attorney, Agent, or Firm—Antonelli, Terry, Stout & Kraus

[57] ABSTRACT

A dry etching method including the steps of introducing etching and deposition gases alternately into a reaction chamber at predetermined time intervals, etching the exposed surface of an article to be etched and applying deposition to the surface film thereof alternately by making plasma generated by applying power to the etching and deposition gases introduced into the reaction chamber come in contact with the article to be etched in the reaction chamber in order to etch the surface, is characterized in that the power is applied after the passage of predetermined time from the start of the introduction of the deposition gas and before the etching gas is introduced and cut off when the introduction of the etching gas is suspended.

8 Claims, 3 Drawing Sheets

DRY ETCHING BY ALTERNATELY ETCHING AND DEPOSITING

BACKGROUND OF THE INVENTION

The present invention relates to a dry etching method and apparatus fit for implementing the so-called gas chopping or time modulated etching method for carrying out plasma etching alternately in different gaseous atmospheres by periodically alternating between deposition and etching gases as a discharge processing gas.

With the miniaturization and integration of semiconductor LSIs, there has developed a demand for extremely high precision etching techniques at a submicron millimeter level during the process of manufacture. In microminiature processing of this sort, the aspect ratio d/r, i.e. the ratio of an aperture diameter r to depth d to be formed tends to increase. The higher the aspect ratio, the lower the etching speed becomes. Moreover, the processing shape also changes with the pattern size.

In microminiature processing of this sort, the present inventor has proposed a method of periodically conducting $SF_6$ and $CCl_4$ plasma etching to reduce the dependence of the etching speed on the aspect ratio; more specifically, the method proposed comprises the step of alternating between $SF_6$ as an etching gas and $CCl_4$ as a deposition gas sequentially at intervals of several seconds using a microwave plasma etching apparatus. This method is known as the so-called gas chopping or time modulated (TM) etching method since it premises the switching of the gas seed in terms of time and has been found noticeable in that the effect of reducing the dependence of the etching speed and the resulting shape on the aspect ratio as compared with plasma etching carried out by mixing these gases simultaneously. Those techniques have already been discussed in a collection of preparatory papers for the 35th applied-physics-related joint lecture, p 28 and following, Mar. 28, 1988 and the 18th (1986 International) Conference on Solid State Devices and Materials, Tokyo, 1986, pp 229-232.

The prior art TM etching method has certainly contributed to reducing the dependence of the etching speed and the resulting shape on the aspect ratio. Although difference in etching speed is on the decrease, depending on the size of the pattern to be formed, this fact is only applicable to a case where the gap between adjoining two patterns is 0.5 μm or thereabout. However, etching accuracy for practical use has not yet been attained in the case of microminiature etching with the gap being not greater than 0.3 μm. In other words, the problem is that a phenomenon generally called the micro-loading effect causes the difference in etching speed between narrow and wide etching portions. Patterns having small and large gaps are simultaneously produced by etching while minimizing the difference in etching speed between the gaps. The important technical task is therefore to establish a practical dry etching method and apparatus by which the etching is carried out while abating the aforementioned micro-loading effect.

SUMMARY OF THE INVENTION

An object of the present invention is to solve the foregoing problems by providing a dry etching method in order to make possible microminiature processing at not greater than 0.3 μm while abating the micro-loading effect.

Another object of the present invention is to provide an improved dry etching apparatus.

The first object of the present invention can be accomplished by a dry etching method as a time modulated dry etching method for carrying out plasma etching by periodically replacing gas while alternating between deposition gas and etching gas at predetermined time intervals, the dry etching method comprising the steps of starting plasma discharge by supplying power for generating plasma prior to an etching gas period (with which the etching gas is introduced), turning the power off at the substantially end of the etching gas period, resupplying the power during the deposition gas period (the deposition gas introduction period) after a predetermined discharge off period, and periodically supplying power for generating plasma in conformity with a gas switching time schedule. If high-frequency bias power is periodically applied to an article to be etched or its periphery within a range of etching gas interlockingly with the etching gas period for a predetermined period of time at the initial stage of the aforementioned etching gas period, further desirable results are obtained. Given an off period of power for generating plasma during the deposition gas period is t, extremely good results are obtained by setting the t at least in satisfaction of the ratio of total gas pressure (VE+VD) to residual etching gas pressure VE in the atmosphere in which the plasma etching is suspended, i.e.

general equation $VE/(VD+VE) \leq 5/100$ where VD=deposition gas pressure.

Although microwave power is preferred for what is applied to generate plasma, it is not always limited thereto and high-frequency power may be supplied to parallel plate type electrodes. Needless to say, any one of known plasma generating sources are usable in this case.

The second object of the present invention is accomplished by providing a time modulated dry etching apparatus comprising a reaction chamber having a built-in means for holding an article to be etched, a discharge means for evacuating the chamber, a power supply means for generating plasma in the reaction chamber, and at least two systems of gas introducing means for periodically supplying at least the etching gas and the deposition gas alternately in terms of time. The dry etching apparatus further comprises a gas switching control device capable of alternately switching the gases from one to the other periodically from time to time in conformity with the respective flows of gas and coupled to the gas introducing means, and a power supply control device for periodically turning on and off the power supply means for generating the plasma interlockingly with the gas switching period of the gas switching control device. It is further preferred for the dry etching apparatus to be equipped with a means for periodically supplying the high-frequency bias power to the article to be etched or its periphery and moreover for the dry etching apparatus to be arranged so that the on/off control of the periodic high-frequency power supply is exercised by the power supply control device interlockingly with the etching gas period. The "off" in the on/off control at the time the high-frequency power supply generally means that the power is completely cut off. However, the intensity of the power may be controlled by an impedance matching circuit provided on the high-frequency power supply side instead of completely cutting off the power as occasion arises.

As the power supply means for generating the plasma, any other known means may be employed. However, the use of the microwave power supply means is practically preferred.

DETAILED DESCRIPTION OF THE PREFERRED EMBODIMENTS

Figure 1:
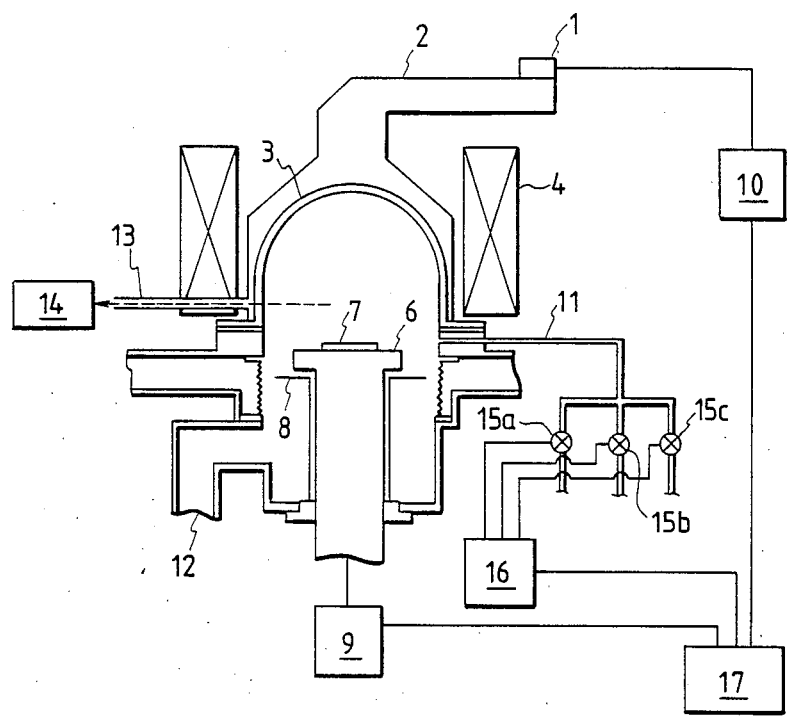
FIG. 1 is a diagram illustrating an example of a sectional structure of the principal part of an dry etching apparatus embodying the present invention.

If a combination of etching with the introduction of an etching gas and deposition with the introduction of a deposition gas is periodically used for plasma etching, a difference in etching speed between narrow and wide gap portions tends to decrease in general. In other words, the etching and deposition speeds both become higher in the wide gap portion than in the narrow gap portion. In the wide gap portion, the influence of the deposition sharply increases and causes the etching speed to decrease, whereby difference in etching speed therebetween decreases. In the case of an extremely fine pattern having a gap of not greater than 0.3 $\mu$m, it still remains difficult to carry out uniform etching free from variations of the etching speed by abating the micro-loading effect only through TM etching for alternating between the etching and deposition gases.

In the present invention, power for generating plasma is not maintained as being applied only while the etching by plasma is carried out as before. The power is applied instead with the passage of a predetermined off time after the deposition gas period is entered, practically preferably at the point of time close to the last stage of the deposition period, i.e. before the etching gas period (during which the etching gas is introduced) is entered, and cut off at the point of time the etching gas period is terminated, i.e., the introduction of the etching gas is suspended. The periodic application of the power for generating plasma is interlocked with the gas switching period in this way. The effect resulting from the simultaneous use of the deposition and the etching becomes far greater than the case of TM and even a pattern such as a fine pattern having a gap of not greater than 0.3 $\mu$m can be formed by uniform etching. As set forth above, according to the present invention, the power for generating plasma is periodically applied with a predetermined off time and ideally at the point of time the gas in a reaction chamber has completely been replaced with the deposition gas after the etching gas period is switched over to the deposition gas period. Notwithstanding, the total plasma etching time becomes longer if the power is kept from being applied until that point of time. When the percentage of the residual etching gas pressure VE in the atmospheric gas of the reaction chamber decreases up to 5% or lower, i.e., time t satisfying the following equation, $$VE(VD+VE) \leq 5/100$$

should practically be set to the off period t. In other words, if the power is supplied 7 seconds after the commencement of the deposition period, excellent results for are practical use are obtainable. In this case, a power supply control device may be used to control the power supply so that the power is supplied at the point of time close to the last stage of the deposition gas period. Moreover, the power off timing should be synchronized with the terminal point of the etching gas period, i.e. when the introduction of the etching gas is suspended with allowance for a slight time lag. When the suspension of power is shifted, it is preferred for the suspension thereof to overlap the last stage of the etching gas period instead of the initial stage of the deposition gas period following the etching gas period.

In the TM etching according to the present invention, high-frequency bias power should preferably be applied to the article to be etched or its periphery at predetermined time intervals during the etching period synchronously with the etching gas period. The supply of the high-frequency bias power is effective in improving the total etching speed. In other words, since a deposition film has been formed at the initial stage of the etching period, the deposition film can be removed by ions with efficiency. If, however, ions are allowed to act excessively by continuously applying the high-frequency bias power during the whole etching period, etching selectivity may be reduced or otherwise the micro-loading effect may become impossible to reduce. The period during which the high-frequency bias power is applied should be set shorter than the etching period to avoid the counter result. With respect to control over the periodic application time of the high-frequency bias power, the power supply control device may be used as in the case of the control of the power supply for generating the plasma.

EMBODIMENT 1

A description will subsequently be given of a first embodiment with reference to a microwave plasma etching apparatus shown in FIG. 1.

FIG. 1 is a sectional view of the principal part of the apparatus embodying the present invention. In FIG. 1, there is shown an arrangement of a microwave generator 1 formed with a magnetron, a waveguide 2, a microwave-transmitting vacuum container (discharge tube) 3, a magnetic coil 4 for generating a magnetic field, a sample stand 6, a sample 7, an electrode 8 for providing fixed potential, a high-frequency power supply 9, a microwave generating power supply 10, a discharge gas introducing tube 11, a gas discharge port 12, a plasma lightening window 13 for a light-emitting monitor, and a light-emitting monitor processing unit 14 which may be replaced with what is heretofore in use. The discharge gas introducing tube 11 is equipped with at least more than two gas lines for deposition and etching gases, three systems 15a, 15b, 15c being provided in this embodiment. The arrangement above includes a gas switching control device 16 for turning on and off these gas lines for a predetermined period of time and a collective control device 17 for comprehensively controlling the high-frequency power supply 9, the microwave generating power supply 10 and the gas switching control device 16 in terms of time. The collective control device 17 may be called a power supply control device since it has the function of controlling the on/off of the microwave generating power supply 10 for generating plasma and the high-frequency power supply 9. Although more than two gas lines, namely, 15a, 15b, 15c are coupled to the discharge gas introducing tube 11, they may of course be coupled to the vacuum chamber directly in parallel. More specifically, if gas is discharged through a bypass discharge line separately installed when one of the gas lines 15a, 15b, 15c is held on while the remaining two lines are held off (not shown), the response speed when these lines are subsequently turned on is high, so that desirous short-time control can be exercised. An impedance matching circuit is provided on the power supply side between the high-frequency power supply 9 and the sample stand 6. The on/off control of the high-frequency power supply need not always be conducted by turning on/off of the power supply but may be based on power strength control (e.g. control of the standing-wave ratio). The electrode 8 for providing fixed potential is fitted like a shield along the outer periphery of the shaft of the sample stand in the vacuum container and its upper portion made of a conductive material expanding along the stand 6. This structure can be altered by increasing the electrode surface for providing the fixed potential when the bias applying value has to be set as high as possible and the place for its installation is also changeable. An embodiment of the etching method including the operation of the apparatus will subsequently described with reference to an embodiment 2.

EMBODIMENT 2

An embodiment of an etching process will be described with reference to FIG. 1. The vacuum container 3 is pre-evacuated by a discharge pump (not shown) through the gas discharge port 12. The etching and deposition gases under reduced pressure are alternately introduced via the gas lines 15a, 15b into the container periodically under the instructions from the gas switching control device 16. The collective control device 17 is operated synchronously with the on/off time schedule of the gas switching control device 16. Under the instructions from the collective control device 17, the microwave generating power supply 10 is periodically turned on and off, whereby plasma is periodically generated as the gas is excited by the microwaves generated by the microwave generator. The waveguide circuit of the waveguide 2 is equipped with an isolator and a power meter (both not shown) in order to improve not only the control of the microwaves but also stability of the apparatus. The magnetic coil 4 is a means for providing a magnetic field for improving the plasma generating efficiency and, provided the intensity of the magnetic field is set at 875 gauss, an electron cyclotron resonance (ECR) state is obtainable because of the interaction of the microwave at 2.45 GHz. However, the magnetic coil is not always necessary since discharge is triggered without the presence of the magnetic field while the gas pressure is high. The reactive active seed in the plasma thus generated reacts with the sample 7 and consequently the etching and the deposition progress alternately and periodically.

Figure 2:
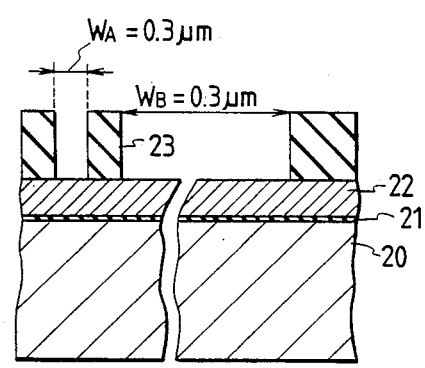
FIGS. 2 and 4 are diagrams illustrating an embodiment of the present invention.

Although the surface material of the sample 7 to be etched is described as what is made of polycrystalline silicon (Poly Si) in this embodiment, the effect is quite similar even if a silicon substrate (Si) is used. A silicon substrate 20 shown in FIG. 2 as a sectional view of its principal part has a silicon oxide film 21 and subsequently a Poly Si 22 thereon and further a resist mask 23 having a narrow gap WA of 0.3 μm and a wide gap WB of 3 μm is formed on the Poly Si 22. As an etching gas, an $SF_6$ gas having a flow rate of 45 cc/min under a gas pressure of 10 m Torr was used, whereas as a deposition gas, a $CCl_4$ gas having a flow rate of 35 cc/min under a gas pressure of 10 m Torr was used. These gases were alternately fed via the respective gas lines 15a, 15b into the vacuum container 3 periodically according to the following time schedule. The power of the microwave was maintained at 300 W for plasma generation. The intensity of the magnetic field was set at maximum 1,000 gauss on top of the vacuum container 3, which was linearly attenuated toward the sample up to minimum 875 gauss.

Figure 4:
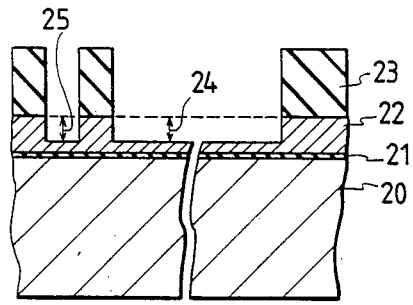
Figure 3:
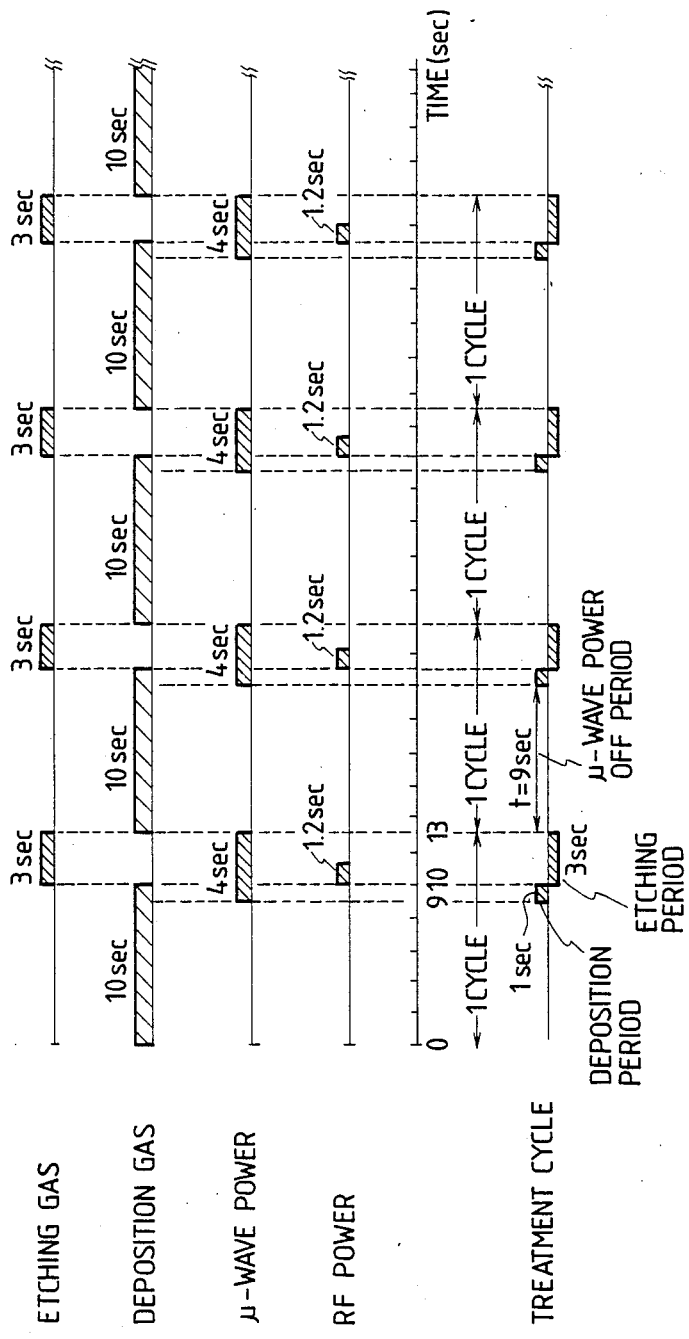
FIG. 3 is a diagram illustrating an example of a TM etching time schedule embodying the present invention.

The periodic gas switching, the microwave discharge and the application of the high-frequency bias power (RF) were conducted according to the time schedule shown in FIG. 3. The operation of alternating between the etching and deposition gases was performed with a period of 3 sec for the former and 10 sec for the latter. The period of the microwave discharge consists of 1 sec prior to the etching gas period (1 sec at the last stage of the deposition gas period), 4 sec of a μ-wave discharge period (power supply period) until the last stage of the etching gas period (3 sec), and 9 sec of a discharge off period (t) afterward. Among these discharge periods, the 1 sec at the last stage of the deposition gas period is a time zone where the deposition is carried out, whereas the 3 sec of the following etching gas period is a time zone where the etching is carried out. In this way, with the alternate repetition of the introduction of the etching gas for 3 sec and the deposition gas for 10 sec as is obvious from the time axis shown on the abscissa of FIG. 3, the plasma etching was carried out. The collective control device 17 for TM etching was set so as to turn on the high-frequency power supply 9 at a level of 30 W for 1.2-1.8 sec from the beginning within the etching period time. When the Poly Si sample was etched accordingly, it exhibited excellent results including wide and narrow gaps which were vertical, superior in etching selectivity relative to the resist masks 23 and moreover substantially equal in depth as shown by retferencial numerals 24, 25 of FIG. 4. Although FIG. 4 refers to a case where the etching of the Poly Si film 22 was suspended, the similar results were also obtained even after the surface of the silicon dioxide film 21 was etched until it was exposed. The micro-loading effect could be thus reduced to the extent that it became insignificant according to the present invention. The difference in etching depth between the narrow and wide gaps in this embodiment was within 3% and therefore practically posed no problem. With replacement of the initial 1.2 sec with 1.0 sec within the etching period time only during which the high-frequency power was applied, the etching speed was seen to decrease sharply. When the aforesaid time was changed to 2 sec, the substrate $SiO_2$ etching speed also increased, though the etching speed was high. When the time was raised to 3 sec (the whole etching period), the selectivity was lowered. The application time of the high-frequency power is therefore apparently important for carrying out the vertical etching with excellent selectivity and the least micro-loading without decreasing the etching speed. The optimum application time of the high-frequency power is needless to say dependent on the gas flow rate, the gas pressure and the microwave power for generating the plasma. At all events, it is not advisable to apply the high-frequency bias power during the whole etching period except during a period of time shorter than the etching period.

As set forth above, the optimum application of the high-frequency bias power is extremely effective in increasing the etching speed and shortening the time desired. However, the high-frequency bias power should not always be applied and it may be applied selectively, depending on the purpose of use. In other words, the conditions under which such power is applied should properly be taken into consideration and the power need not be applied unless the throughput (etching speed) is called in question. In this case, although the etching time will become longer than what is required when the high-frequency power is applied, the advantage is that the selectivity is prevented from being lowered.

In the etching process of FIG. 3, the first high-frequency bias (RF) application time within the 3 sec etching period is spent in removing deposition-separated material by etching, whereas the remaining time is spent in substantially etching the sample Si.

A detailed description will subsequently be given of discharge off time after the etching period (a period during which the etching gas is removed by introducing the deposition gas without applying $\mu$-wave power). In FIG. 3, no vertical etching was possible when the $\mu$-wave discharge off period was changed from 9 sec to less than 6 sec. If the discharge off time is shortened in this manner, plasma etching is carried out in such a state that the replacement of the etching gas with the deposition gas is insufficient and a sizable amount of etching gas is left in the reaction chamber. The deposition was therefore not conducted and there arose an undercut without the formation of a film for protecting the side wall. The micro-loading effect grew up to the extent that the object of the present invention could not be accomplished when the discharge off time was 6 sec or shorter. According to the findings of the present inventor, the micro-loading effect and the undercut were proved to be not insignificant if the residual etching gas ($SF_6$) of exceeding 5% was contained in the deposition gas ($CCl_4$); that is, it was confirmed that the deposition was not carried out if the etching gas $SF_6$ of more than 5% was contained in the whole gas flow rate, though the etching was carried out, whereas the deposition was carried out if not higher than 5% of it was contained therein, the deposition instead of the etching was carried out. Since the mixture ratio of $SF_6$ causes the deposition to be carried out, provided the $SF_6$ to ($SF_6+CCl_4$) gas pressure ratio becomes not higher than 5/100 in an apparatus having any discharge and gas introducing systems, it is only necessary to set a time exceeding what is required for the gas pressure ratio to become not higher than 5/100 even though the setting of each of the gas pressures and the flow rates is altered as the discharge off time. Although the shortest time can be set only by making preparatory testing, a light-emitting spectrum or a mass spectrometer may be employed as a means for measuring the actual gas pressure ratio to detect $F^{+,*}/Cl^{+,*}$ for the purpose of having the deposition period automatically followed. The effect can be obtained by using gases other than $SF_6$ and $CCl_4$ as the etching and deposition gases.

In the conventional TM etching, no discharge off time has been provided after the etching period by synchronizing the etching period with the high-frequency bias period as in the case of the embodiment shown and the $\mu$-wave discharge has been made continuously instead. For this reason, it has heretofore been arranged that the deposition period time is set sufficiently long to make the etching conducted at the early stage of the deposition gas period and to make the deposition conducted at the later stage thereof. As the result, the reproducibility of the deposition quantity is bad in the conventional TM etching and besides, the time required to completely remove the deposition film in the etching period is not constant; i.e., the disadvantage is that the micro-loading effect is decreased enough to improve the selectivity. To obviate the disadvantage, at least discharge off time should be provided after the etching period and, unless any problem is posed on the throughput, the discharge off time should be provided after the deposition period. The provision of the discharge off time contributes to not only effective gas replacement but also prevention of a rise in sample temperature. In other words, 9 sec discharge off time relative to 4 sec discharge time was set in this embodiment to make the discharge-off-time to discharge-time ratio 2.2, whereby the sample temperature could be decreased to approximately $\frac{1}{2}$, compared with the conventional case. A mild fluctuation in temperature in this case is extremely effective in stabilizing deposition and etching.

As is obvious from the embodiment shown, the relationship between the application time of the high-frequency power and the discharge off time after the etching period is apparently important for carrying out the vertical etching with excellent selectivity and the least micro-loading without decreasing the etching speed. Their optimum time is, needless to say, dependent on the gas flow rate, the gas pressure and the microwave power for generating plasma. As the thickness of the deposition film could be increased within one and the same 1 sec deposition time by increasing the $CCl_4$ gas flow rate and the gas pressure to 45 cc/min and 15 m Torr while decreasing the microwave power to 250 W, for instance, the RF bias application time 2.1 sec–2.7 sec was preferred to 1.2 sec–1.8 sec (40–60% of the etching time). In this case, the $SF_6$ gas flow rate, the gas pressure and the etching time were set equal to those employed in the embodiment 1. When the discharge off time after the etching period decreased to not greater than 4 sec, the time required was shortened by approximately 2 sec, though the etching anisotropy slightly decreased. Even though the deposition efficiency was moderately increased, minimum 4 sec discharge off time was necessary and the RF bias application time amounting to 70% –90% of the etching time was proved most suitable. When the deposition efficiency was set to be increased, the film formation became greater in degree than etching and this not only made odd the shape obtained by the etching but also sharply reduced the throughput. No practical etching technique was therefore available. The discharge off time could not be decreased up to zero even if the etching conditions were changed over a fairly wide range. It was consequently proved unadvisable to apply the RF bias continuously within the whole etching period.

Figure 5:
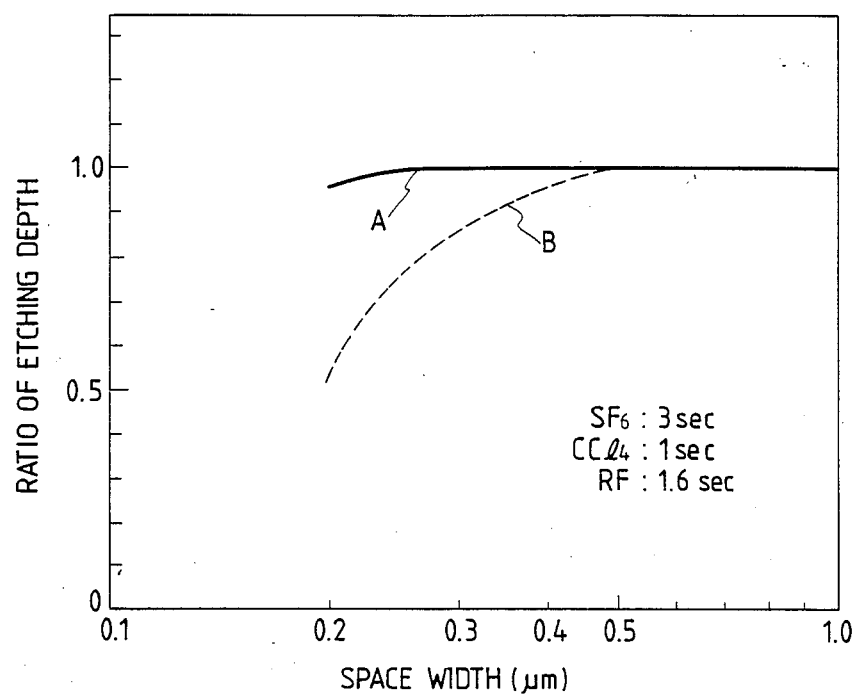
FIG. 5 is a graph illustrating an example of the effect of the present invention.
Figure 6:
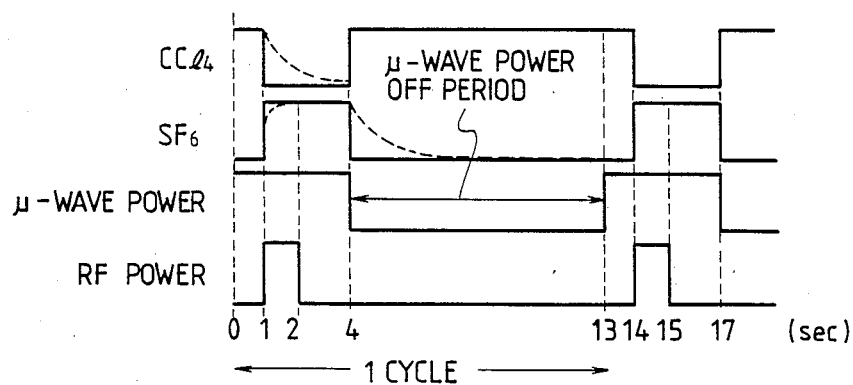
FIG. 6 is a diagram illustrating what is equivalent to one cycle of a typical time schedule according to the present invention.

FIG. 5 is a graph showing a comparison between 9 sec discharge off time and conventional TM etching without providing discharge off time with the relation of gap width to etched depth of a pattern. The abscissa axis represents the dimensions of the narrow gap of the pattern, whereas the ordinate axis represents etched depth ratio with the etched depth in the wide gap or field wherein no micro-loading effect is generated as 1. The ordinate axis ratio at 1 in FIG. 5 means that the wide and narrow gaps are equal in depth and further that the etching speeds on the Si surface are equal regardless of the gap width. Even though the gap dimension on the abscissa axis becomes narrow, excellent etching properties free from the micro-loading effect are exhibited on condition that the etching depth ratio is maintained at a value sufficiently close to 1. In FIG. 5, a dotted line B represents an example obtained from the conventional TM etching wherein the etched depth ratio starts to become lower when the gap width decreases to not greater than 0.5 $\mu$m and becomes even halved, i.e. approximately 0.5 when the gap width becomes 0.2 $\mu$m. On the other hand, a curve A represents what has been obtained from the present invention; i.e., this result is obtained on condition that the RF power 30 W is applied by a 3 sec $SF_6$ etching period, a 1 sec $CCl_4$ deposition period, 9 sec discharge off time immediately after the etching period and a beginning 1.6 sec etching period. However, the etched depth ratio is kept substantially constant at 1 up to a gap of 0.25 $\mu$m and exhibits superior properties. FIG. 6 shows a control flow equivalent to one cycle by which the micro-loading effect can be minimized according to the present invention. As set forth above, the optimum value of the application time of the RF power varies with the gas seed for use in etching and deposition, each of the introducing periods, the flow rate, the pressure, the RF power, the $\mu$-wave power, etc. Consequently, the aforementioned 1.6 sec is not an optimum constant value.

EMBODIMENT 3

Although the $SF_6$ and $CCl_4$ gases were employed in Embodiment 1, the same effect as that of Embodiment 1 was obtained from the use of a gas containing C, Cl, F such as $C_2Cl_3F_3$ and $C_2ClF_5$, a gas containing Si, H, Cl such as $SiHCl_3$ and $SiH_3Cl$, a gas containing C, H, Cl such as $CHCl_3$ and $CH_3Cl$ and a gas containing C, Br, F such as $CBrF_3$ and $C_2Br_2F_4$ as the deposition gas. However, the gas used in this embodiment had inferior deposition properties with the same gas flow rate and gas pressure as those of $CCl_4$ and the deposition period time had to be slightly prolonged. In the gas system of this embodiment, the smaller the number of Cls, the longer the aforementioned time had to be made. The gas flow rate and the gas pressure may be increased to shorten the time and, when the processing time is limited, the setting of the flow rate and the pressure can be altered.

EMBODIMENT 4

Although Si, Poly Si were employed as materials to be etched in Embodiment 1, the present invention is especially effective for any materials which are likely to produce the undercut by normal etching. In the case of materials including Al, W, Mo and various metal silicides used for the manufacture of semiconductor devices, the undercut is readily produced unless the normal etching is carried out under extremely limited conditions. In this embodiment, the TM etching according to the present invention was applied to Al, W and tungsten silicide and good results were obtained; needless to say, the same result is obtainable from materials similar to them. With respect to W and tungsten silicide, the result was obtained therefrom under the gas and etching conditions used in Embodiment 1. As for Al, use can be made of a combination of $Cl_2$ as the etching gas, $CCl_4$, $SiCl_4$ as the deposition gas employed in Embodiment 2.

EMBODIMENT 5

In the etching apparatus shown in Embodiment 1, two kinds of high-frequency power 800 kHz, 30 W and 13.56 MHz, 150 W were employed only to find the same results. The reason for the power value to vary, depending on the frequency applied, is considered attributable to variations of the accelerating voltage for making ions existing in the plasma collide with the surface of the sample. Therefore, it is needless to say necessary to set power fit for frequency to be used. Although the higher the power, the greater not only the deposition film removing speed but also the etching speed becomes, excessively high speed poses another serious problem in that the etching speed of the aforementioned mask material grows greater, whereas if the speed is too low, the deposition film removing speed decreases to prolong the processing time. In other words, the aforementioned value should preferably be set as a reference.

EMBODIMENT 6

No temperature control over the sample to be etched was conducted in each of the foregoing embodiments. Although the silicon wafer as the sample is mounted on the sample stand, the sample temperature fluctuates as the plasma irradiating condition differs and becomes irregular because the thermal contact between the samples even though the material stand is kept being cooled. In this embodiment, there was provided a cooling means for making it possible to maintain the sample stand at lower than the water-cooling temperature; i.e. a heater combined with liquid nitrogen or a combination of a refrigerator and the heater were adopted. The temperature of the inner wall of the vacuum container other than the sample stand may be set at normal temperature.

Since the adsorption efficiency of each gas is increased in the case of the low temperature etching, it was proved that the flow rate and pressure of the deposition gas in particular could be lowered. When the sample temperature was actually set at $-30°$ C., the same result was seen to be obtainable even though both the flow rate and pressure of the deposition gas $C_2Cl_3F_3$ were halved. In the case of the $C_2Cl_3F_3$ gas, on the contrary, the deposition film formation efficiency may be too low to attain the purpose of the TM etching even though the gas flow rate and the pressure are increased when the sample temperature exceeds 40° C. If the deposition gas can be decreased while only the sample temperature is kept low, stains on the inner wall of the vacuum container can be reduced, which is very advantageous to semiconductor manufacturing apparatus. The value that makes the sample temperature effective naturally varies with the kind of deposition gas.

Those methods recited in the embodiments shown are usable for improving the vertical etching and the selectivity over a fairly wide range of conditions. Moreover, the etching period, the deposition period and the application time of the high-frequency power should be set at the levels described above to reduce the micro-loading effect in the low temperature etching.

EMBODIMENT 7

While a gate electrode or the like is formed by etching during the process of manufacturing MOS transistors, overetching is slightly carried out after the end of etching is reached. Most of the description given in the preceding embodiments refers to the etching until the end of etching has been reached. However, the overetching need not always be continued by means of the TM etching. Although an actual gate electrode is often formed with a multilayer film, the upper and lower layers need not be subjected to the TM etching. In other words, the TM etching conditions may be varied or otherwise etching methods through the ordinary continuous discharge may be combined without employing the TM etching in line with the purpose intended.

This embodiment relates to overetching for the formation of a gate electrode.

A $SiO_2$ film as thin as several tens up to several 100 Å, with level difference over the whole surface, was formed under a gate electrode material layer. Over 100% overetching is often needed to totally remove the remaining gate electrode material on the surface having a difference in level. In this case, care must be taken not to allow the thin $SiO_2$ film to disappear and simultaneously not to make the gate electrode side-etched during the etching for hours. The deposition should be minimized as the etching conditions excellent in selectivity; e.g., the TM etching should be carried out only for patterning the gate electrode material and the overetching should better be carried out not with the TM etching but only $SF_6$ and further the RF bias should be made zero. In this case, however, approximately 200% overetching started to cause the side-etching. When over 200% overetching is required, measures should be taken to change the TM etching conditions during etching; e.g., by setting the etching time at 5 sec and the remaining conditions equal to those employed in Embodiment 1, the gate electrode material having difference in level could be etched without causing the $SiO_2$ film to disappear and without the side-etching up to approximately 300% overetching. An etching process fit for the actual element structure can be build up by setting TM etching conditions on a step basis as in the case of this embodiment, whereby such a process brings about the results that have heretofore been impossible to accomplish. Optimum etching can also be carried out, provided TM etching conditions intended for each layer of the aforementioned multilayer film to be etched are examined beforehand and converted into programs with each layer as one step.

As set forth above, it becomes possible to prevent the micro-loading effect that has heretofore been unavoidable in a gap of not greater than 0.3 μm according to the present invention. Consequently, the present invention is highly effective in finely processing and manufacturing semiconductor ICs having a mixture of gaps different in dimension on the same etching surface. When the $SiO_2$ base film is thin or when the Si substrate is etched, the etching method embodying the present invention is particularly effective in obtaining the results that have heretofore been accomplished. Good results are also obtainable according to the present invention by using either microwave plasma etching or known parallel flat dry etching apparatus.

What is claimed is:

1. A dry etching method comprising the steps of:
   alternately introducing an etching gas and a deposition gas into a reaction chamber at predetermined time intervals; and
   alternately etching an exposed surface of an article to be etched and causing a film to be deposited on said surface of said article by applying a first power to said introduced etching and deposition gases to alternately generate an etching plasma and deposition plasma, said etching and deposition plasma alternately coming into contact with said article to be etched said reaction chamber in order to alternately etch and cause a film to be deposited on said surface so as to etch said surface, and said first power being applied after passage of a predetermined amount of time from the start passage of a predetermined amount of time from the start of the introduction of said deposition gas and before the introduction of said etching gas and cut off when the introduction of said etching gas is suspended; and
   applying a second power to said article to be etched when the introduction of said etching gas is started and cutting off said second power at a time prior to suspension of the introduction of said etching gas.

2. A dry etching method as claimed in claim 1, wherein said first power is μ-wave power.

3. A dry etching method as claimed in claim 1, wherein said etching gas is $SF_6$.

4. A dry etching method as claimed in claim 1, wherein said deposition gas is selected from the group consisting of $CCl_4$, $C_2Cl_3F_3$, $C_2ClF_5$, $SiH_3Cl$, $CHCl_3$, $CH_3Cl$, $CBrF_3$ and $C_2Br_2F_4$.

5. A dry etching method as claimed in claim 1, wherein said first power is applied to a parallel plate type electrode provided in said reaction chamber.

6. A dry etching method as claimed in claim 1, wherein the predetermined amount of time from the start of the introduction of said deposition gas to the application of said first power is selected so as to make a ratio of (VE+VD) to residual etching gas pressure VE in said reaction chamber satisfy the following equation:

$$VE/(VD+VE) > 5/100,$$

where VD = deposition gas pressure.

7. A dry etching method as claimed in claim 1, wherein said second power is RF power.

8. A dry etching method comprising the steps of:
   alternately introducing an etching gas and a deposition gas into a reaction chamber at predetermined time intervals; and
   alternately etching an exposed surface of an article to be etched and causing a film to be deposited on said surface of said article by applying power to said introduced etching and deposition gases to alternately generate an etching plasma and deposition plasma said etching and deposition plasma alternately coming into contact with said article in said reaction chamber in order to alternately etch and cause a film to be deposited on said surface of said article so as to etch said surface, and said power being applied after passage of a predetermined amount of time from the start of the introduction of said deposition gas and before the introduction of said etching gas and cut off when the introduction of said etching gas is suspended.

* * * * *